(12) United States Patent
Polet et al.

(10) Patent No.: US 9,274,436 B2
(45) Date of Patent: Mar. 1, 2016

(54) LITHOGRAPHIC APPARATUS AND A DEVICE MANUFACTURING METHOD

(71) Applicants: Theodorus Wilhelmus Polet, Grave (NL); Henrikus Herman Marie Cox, Eindhoven (NL); Ronald Van Der Ham, Maarheeze (NL); Wilhelmus Franciscus Johannes Simons, Beesel (NL); Jimmy Matheus Wilhelmus Van De Winkel, Kessel (NL); Gregory Martin Mason Corcoran, Eindhoven (NL); Frank Johannes Jacobus Van Boxtel, Eindhoven (NL)

(72) Inventors: Theodorus Wilhelmus Polet, Grave (NL); Henrikus Herman Marie Cox, Eindhoven (NL); Ronald Van Der Ham, Maarheeze (NL); Wilhelmus Franciscus Johannes Simons, Beesel (NL); Jimmy Matheus Wilhelmus Van De Winkel, Kessel (NL); Gregory Martin Mason Corcoran, Eindhoven (NL); Frank Johannes Jacobus Van Boxtel, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 513 days.

(21) Appl. No.: 13/693,923

(22) Filed: Dec. 4, 2012

(65) Prior Publication Data

US 2013/0149649 A1  Jun. 13, 2013

Related U.S. Application Data

(60) Provisional application No. 61/567,988, filed on Dec. 7, 2011.

(51) Int. Cl.
*G03F 7/20* (2006.01)

(52) U.S. Cl.
CPC .......... *G03F 7/70341* (2013.01); *G03F 7/2041* (2013.01); *G03F 7/70758* (2013.01); *G03F 7/70783* (2013.01).

(58) Field of Classification Search
CPC .............. G03F 7/2041; G03F 7/70341; G03F 7/70758; G03F 7/70783
See application file for complete search history.

(56) References Cited

U.S. PATENT DOCUMENTS

| 4,509,852 | A  | 4/1985 | Tabarelli et al.   |
| 7,352,435 | B2 | 4/2008 | Streefkerk et al.  |

(Continued)

FOREIGN PATENT DOCUMENTS

| EP | 1 420 298    | 5/2004 |
| JP | 2005-175438  | 6/2005 |

(Continued)

OTHER PUBLICATIONS

U.S. Appl. No. 61/506,442, filed Jul. 11, 2011, Rogier Hendrikus Magdalena Cortie et al.

(Continued)

*Primary Examiner* — Steven H Whitesell Gordon
(74) *Attorney, Agent, or Firm* — Pillsbury Winthrop Shaw Pittman LLP

(57) ABSTRACT

A lithographic apparatus having: a substrate table constructed to hold a substrate; a projection system configured to project a patterned radiation beam onto a target portion of the substrate; a substrate surface actuator including a fluid opening for fluid flow therethrough from/onto a facing surface facing the substrate surface actuator to generate a force between the substrate surface actuator and the facing surface, the facing surface being a top surface of the substrate or a surface substantially co-planar with the substrate; and a position controller to control the position and/or orientation of a part of the facing surface by varying fluid flow through the fluid opening to displace the part of the facing surface relative to the projection system.

21 Claims, 10 Drawing Sheets

(56) References Cited

U.S. PATENT DOCUMENTS

| | | | |
|---|---|---|---|
| 2003/0197914 A1* | 10/2003 | Cox et al. | 359/223 |
| 2004/0207824 A1 | 10/2004 | Lof et al. | |
| 2005/0174550 A1 | 8/2005 | Streefkerk et al. | |
| 2005/0213066 A1* | 9/2005 | Sumiyoshi | 355/53 |
| 2005/0259233 A1* | 11/2005 | Streefkerk et al. | 355/53 |
| 2006/0038968 A1 | 2/2006 | Kemper et al. | |
| 2006/0158627 A1 | 7/2006 | Kemper et al. | |
| 2007/0081133 A1* | 4/2007 | Kayama et al. | 355/53 |
| 2007/0242241 A1* | 10/2007 | Nagasaka et al. | 355/30 |
| 2008/0032234 A1* | 2/2008 | Mizutani | 430/311 |
| 2008/0212046 A1 | 9/2008 | Riepen et al. | |
| 2009/0279060 A1 | 11/2009 | Direcks et al. | |
| 2009/0279062 A1 | 11/2009 | Direcks et al. | |
| 2010/0290013 A1 | 11/2010 | De Metsenaere et al. | |
| 2010/0313974 A1 | 12/2010 | Riepen et al. | |

FOREIGN PATENT DOCUMENTS

| | | |
|---|---|---|
| JP | 2006-165502 | 6/2006 |
| JP | 2010-097970 | 4/2010 |
| JP | 2010-267961 | 11/2010 |
| JP | 2011-023764 | 2/2011 |
| JP | 2011-119746 | 6/2011 |
| JP | 2011-160000 | 8/2011 |
| WO | 99/49504 | 9/1999 |
| WO | 2006/106836 | 10/2006 |

OTHER PUBLICATIONS

Japanese Office Action mailed Feb. 10, 2014 in corresponding Japanese Patent Application No. 2012-239466.

* cited by examiner

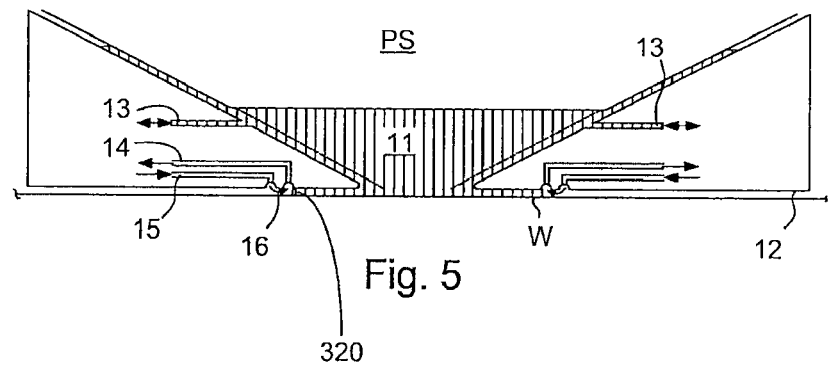
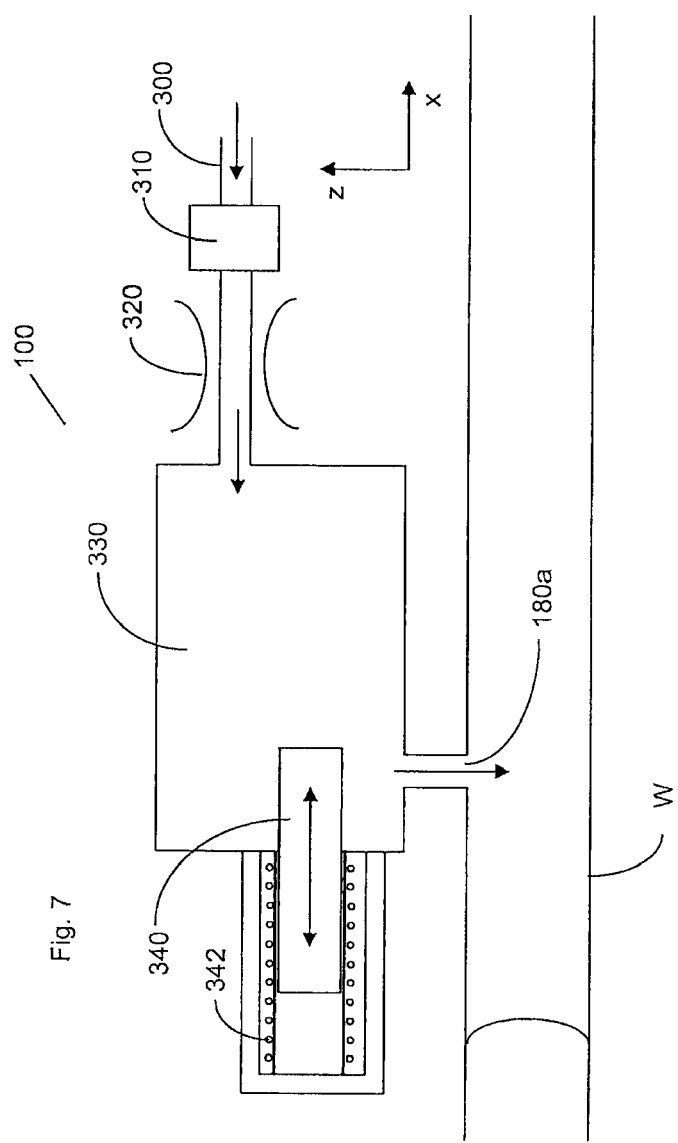

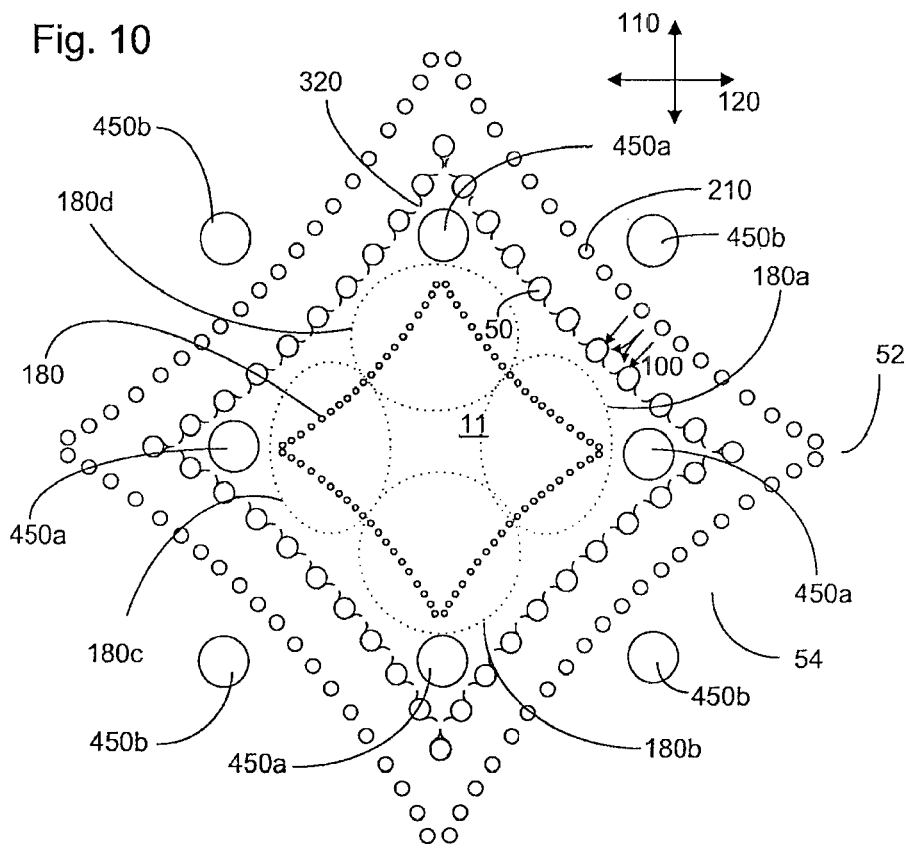
Fig. 10
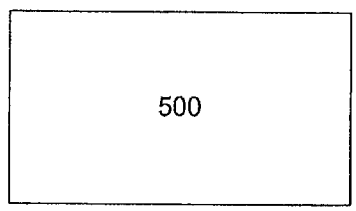

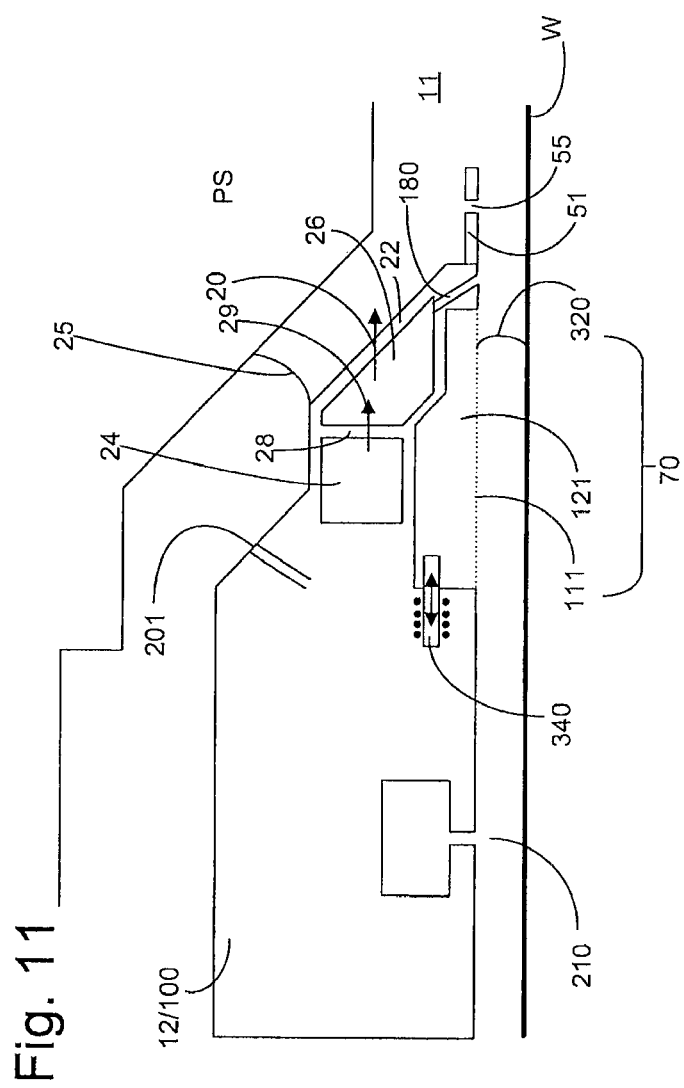

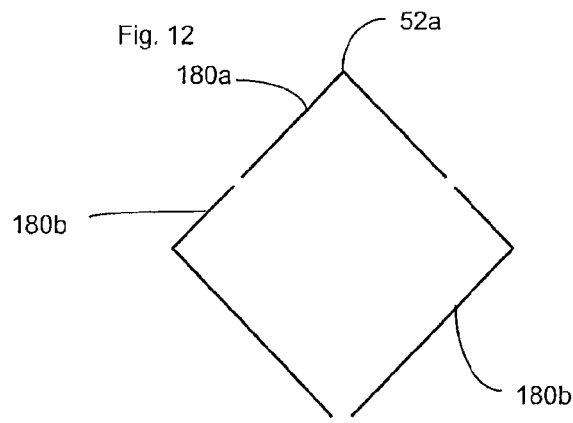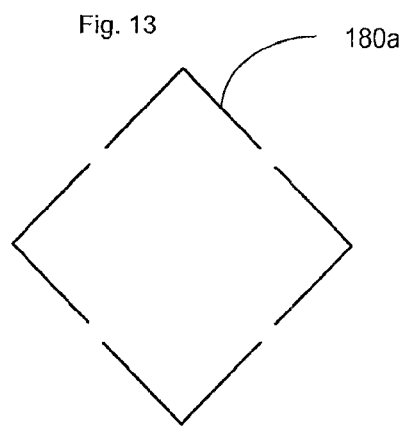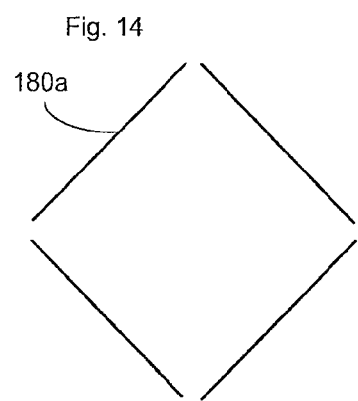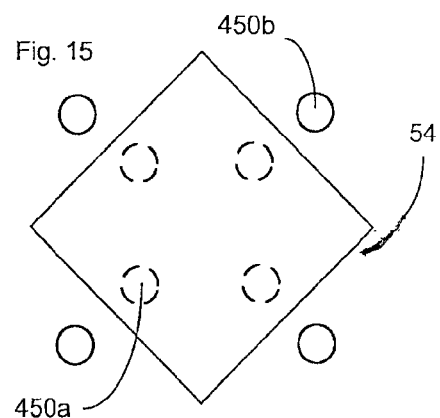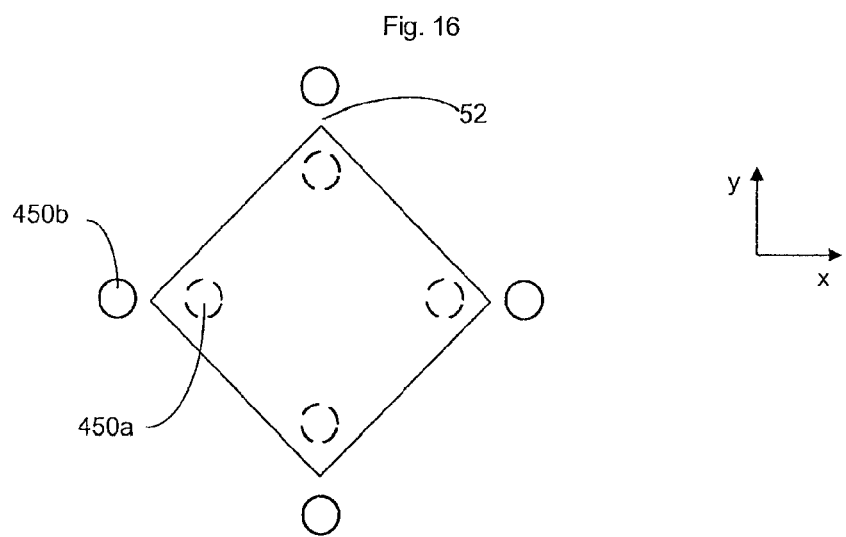

Fig. 21
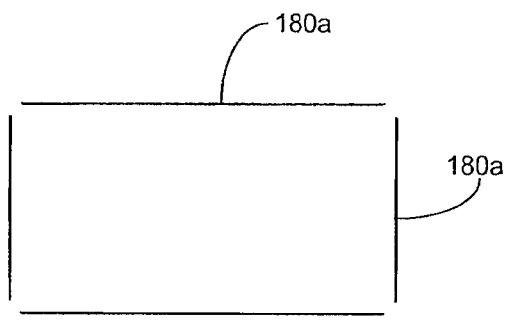
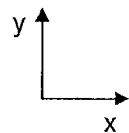
Fig. 22
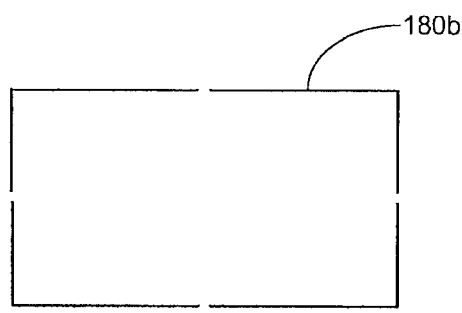
Fig. 23
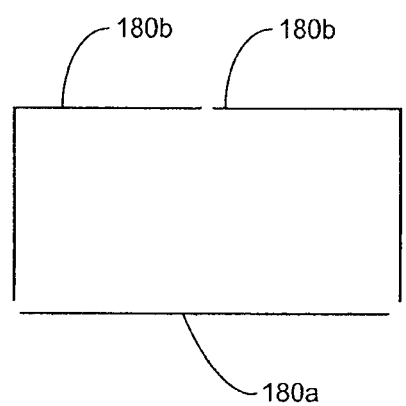

LITHOGRAPHIC APPARATUS AND A DEVICE MANUFACTURING METHOD

This application claims priority and benefit under 35 U.S.C. §119(e) to U.S. Provisional Patent Application No. 61/567,988, filed on Dec. 7, 2011. The content of that application is incorporated herein in its entirety by reference.

FIELD

The present invention relates to a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In a lithographic apparatus, there exists a difficulty that a positioning actuator to position the substrate may apply a force to the substrate some distance from a target portion of the substrate which is currently being illuminated. This can result in difficulty in positioning the target portion of the substrate accurately. The difficulty can arise, for example, due to a variation in force being applied to the substrate (for example from a fluid handling system) or due to the stiffness of a substrate support allowing some bending of the substrate.

It is desirable, for example, to be able to accurately position a target portion of a substrate in a lithographic apparatus.

According to an aspect, there is provided a lithographic apparatus comprising: a substrate table constructed to hold a substrate; a projection system configured to project a patterned radiation beam onto a target portion of the substrate; a substrate surface actuator comprising at least one fluid opening for fluid flow therethrough from/onto a facing surface facing the substrate surface actuator to generate a force between the substrate surface actuator and the facing surface, the facing surface being a top surface of the substrate or a surface substantially co-planar with the substrate; and a position controller to control the position and/or orientation of a part of the facing surface by varying fluid flow through the fluid opening to displace the part of the facing surface relative to the projection system.

According to an aspect, there is provided a device manufacturing method comprising: using a projection system to project a patterned radiation beam onto a target portion of a substrate; and using a substrate surface actuator to control a position and/or orientation of a facing surface facing the substrate surface actuator relative to the projection system by varying fluid flow from/onto the facing surface through at least one fluid opening of a substrate surface actuator, the facing surface being a top surface of the substrate or a surface substantially co-planar with the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 7 depicts, in cross-section, one way in which the force between a substrate surface actuator and the substrate may be varied;

FIG. 10 depicts, in plan, a substrate surface actuator of an embodiment;

FIG. 11 depicts, in cross-section, a substrate surface actuator of an embodiment;

FIG. 12 illustrates, schematically and in plan, a substrate surface actuator of an embodiment;

FIG. 13 illustrates, schematically and in plan, a substrate surface actuator of an embodiment;

FIG. 14 illustrates, schematically and in plan, a substrate surface actuator of an embodiment;

FIG. 15 illustrates, schematically and in plan, a substrate surface actuator of an embodiment;

FIG. 16 illustrates, schematically and in plan, a substrate surface actuator of an embodiment;

FIG. 21 illustrates, schematically and in plan, a substrate surface actuator of an embodiment;

FIG. 22 illustrates, schematically and in plan, a substrate surface actuator of an embodiment; and FIG. 23 illustrates, schematically and in plan, a substrate surface actuator of an embodiment.

DETAILED DESCRIPTION

Figure 1:
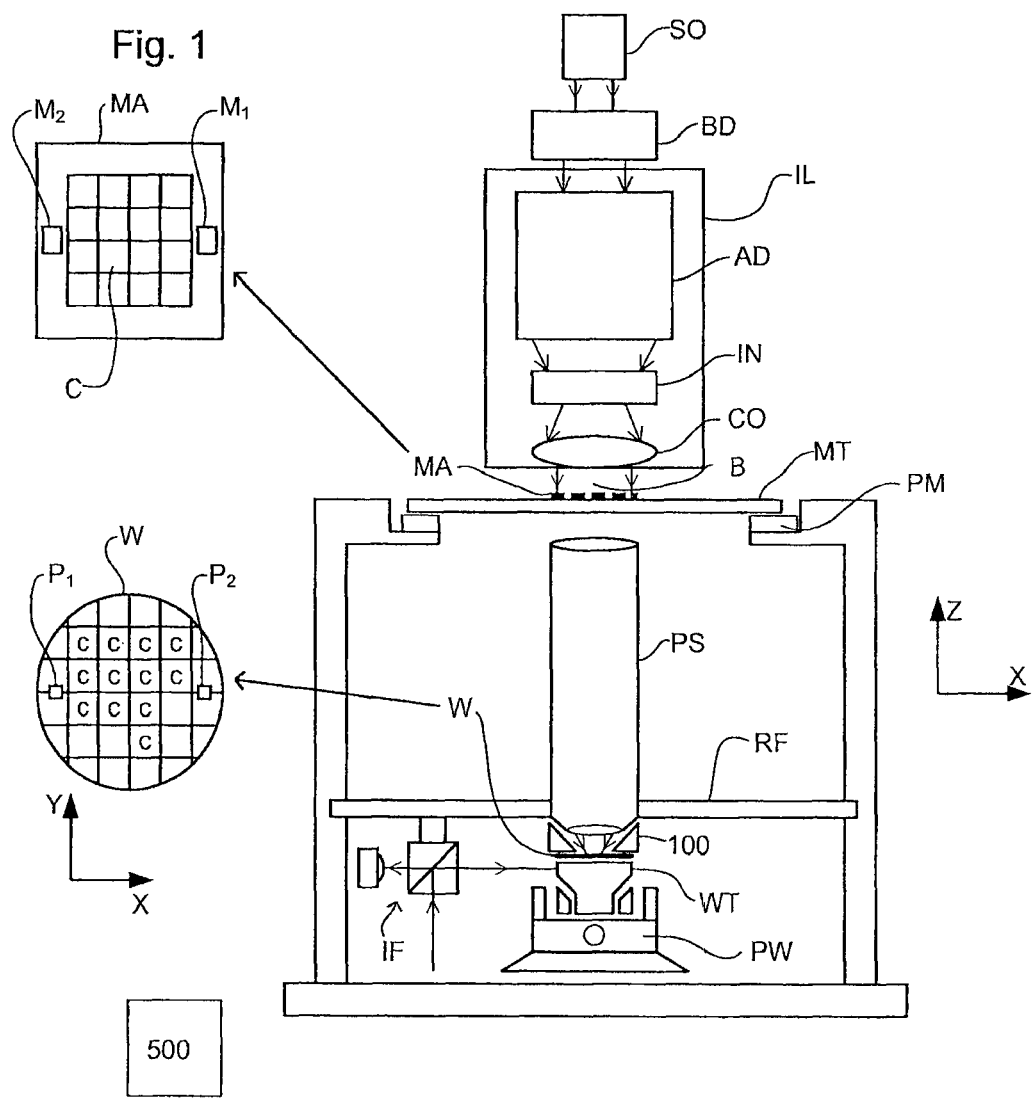
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stages or supports), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure.

The lithographic apparatus may have two or more patterning device tables (or stages or supports) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

In a lithographic apparatus the position of a substrate is changed using the second positioner PW. The second positioner PW changes the position of a substrate support on which the substrate W sits. There can be some distance between the actuators of the second positioner PW and part of the substrate W where the substrate W is being illuminated (e.g. at a target portion C). Additionally the substrate support may not be perfectly stiff so that it becomes difficult, if not impossible, to accurately position the substrate W based only on signals sent to the second positioner PW.

With an increase in the substrate area, unless a substrate table WT and substrate stage is made thinner, the depth of the substrate table WT is increased in the same proportion as the width and the length of the substrate table WT, and thus the width (e.g., diameter) of the substrate. Thus, although, for example, for a 450 mm substrate W relative to a 300 mm substrate, the diameter increases proportionately by 50%, the area of the substrate W and substrate table WT each increases by 125% and the volume and mass of the substrate table WT would increase by almost 240%. Such an increase in volume is undesirable. However, in having a thinner substrate table WT, the table is less stiff, more flexible and susceptible to bending. Consequently, accurate positioning of the substrate table WT and the substrate W it is supporting is more difficult. A measure should be provided to enable such a more flexible substrate table WT to be used effectively, i.e. its position to be sufficiently accurately known.

It would be desirable, for example, to position and/or orientate the substrate W by applying a force at a position closer to the target portion C of the substrate W. For example, positioning the substrate by applying a force directly to the substrate W within a distance of less than 10 target portion C widths (e.g. the dimension of a target portion in a direction orthogonal to the scanning direction and in the plane of the top surface of the substrate W) would be beneficial. This is because the closer the force can be applied to the portion of the substrate W currently being imaged (i.e. the part which is most important) the more accurately positioned that part of the substrate can be. In an embodiment the force is applied at least one target portion C width from the optical axis, desirably at least two. This is because the further from the optical axis the force is applied, the lower the force needs to be to move the substrate W.

Figure 6:
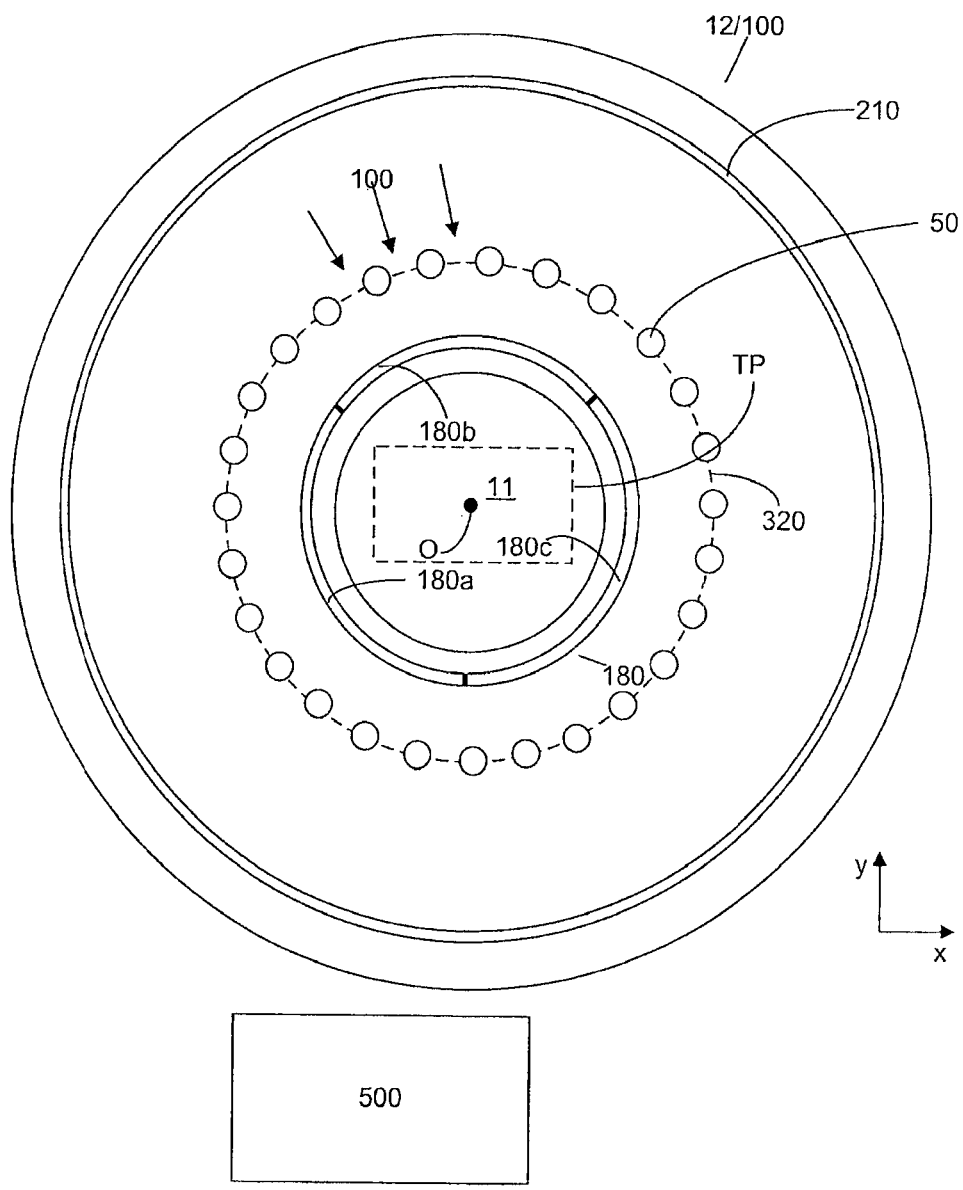
FIG. 6 depicts, in plan, a substrate surface actuator of an embodiment.

In an embodiment of the present invention, a substrate surface actuator 100 such as illustrated in FIGS. 1 and 6 is provided. The substrate surface actuator 100 generates a force between the substrate surface (the top surface) and the substrate surface actuator 100. An embodiment is described below with reference to the force being applied to the substrate W, but the invention is not limited to this. The substrate surface actuator 100 is an actuator which applies a force of a surface which is substantially in the plane of a substrate W when mounted on a substrate supportable WT. This includes the surface of the substrate table WT around the substrate W and any other table such as another substrate table WT, a measurement table and/or a table used for substrate W swap. Reference to a top surface of a substrate W includes any surface which is substantially co-planar with such a top surface of a substrate or moves beneath the projection system PS and so 'faces' the projection system PS, i.e. is a facing surface. The substrate surface actuator 100 can be used to control the position and/or orientation of a portion of the facing surface.

In an embodiment the force is applied in a non-physical contact manner, for example with a fluid. For this purpose, the substrate surface actuator 100 has at least one fluid opening for fluid flow therethrough from and/or onto a top surface of the substrate W. The flow therethrough generates the force between the substrate surface actuator 100 and the substrate W.

A position controller 500 is configured to control the position of the substrate W by varying fluid flow through the fluid opening of the substrate surface actuator 100. Varying fluid flow through the fluid opening displaces the substrate W (because of the change in force applied to the substrate W). This can be used to change the position of the substrate W relative to the projection system PS. The position controller 500 may be the same position controller or a different position controller to the one which controls the second positioner PW.

In an immersion lithographic apparatus, liquid is provided between a final element of a projection system PS and the substrate W. A fluid handling system 12 confines liquid to a space between a final element of the projection system PS and the substrate W. Such a fluid handling structure 12 often applies a force between the fluid handling system 12 and the substrate W. The force applied can vary (in particular if there is two phase extraction of fluid between the fluid handling structure 12 and the substrate W). Such variation in force can lead to displacement of the target portion C of the substrate W relative to the projection system PS and thereby imaging errors.

The provision of a fluid handling structure 12 in an immersion lithographic apparatus is convenient for the case where a substrate surface actuator 100 is provided. This is because the fluid opening of the substrate surface actuator 100 can be a pre-existing opening in the fluid handling structure 12 which handles immersion fluid and/or other fluid to control the position and/or supply of immersion fluid. Alternatively or additionally, the fluid opening of the substrate surface actuator 100 can be a separate opening in the fluid handling structure 12 which has no purpose other than to provide the force required of the substrate surface actuator 100.

For simplicity some embodiments will be described in which the fluid opening of the substrate surface actuator 100 is provided in a fluid handling structure 12 of an immersion lithographic apparatus. However, an embodiment of the invention can be applied to a non-immersion lithographic apparatus, for example as will be described with reference to FIGS. 8 and 9 below.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. One way which has been proposed to arrange for this is disclosed in PCT patent application publication no. WO 99/49504. The space filled by liquid is smaller in plan than the top surface of the substrate and the area filled with liquid remains substantially stationary relative to the projection system PS while the substrate W moves underneath that area. FIGS. 2-6, 10 and 11 show different supply devices which can be used in such a system. A sealing feature is present to seal liquid to the localized area.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and the facing surface facing. Any of the liquid supply devices of FIGS. 2-6, 10 and 11 can also be used in such a system. However, a sealing feature is not present, not activated, not as efficient as normal or otherwise ineffective to seal liquid to only the localized area.

Figure 2:
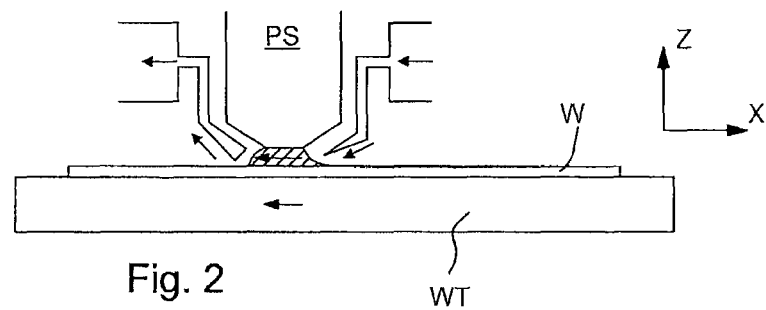
FIGS. 2 and 3 depict a liquid supply system for use in a lithographic projection apparatus.
Figure 3:
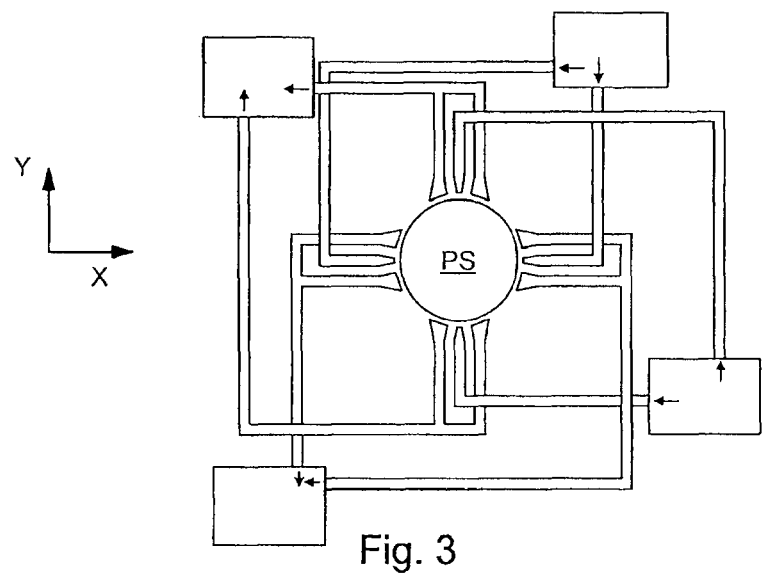

As illustrated in FIGS. 2 and 3, liquid is supplied by at least one inlet onto the substrate, desirably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via an inlet and is taken up on the other side of the element by an outlet which is connected to a low pressure source. In the illustration of FIG. 2 the liquid is supplied along the direction of movement of the substrate relative to the final element, though this does not need to be the case. Various orientations and numbers of in-and outlets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
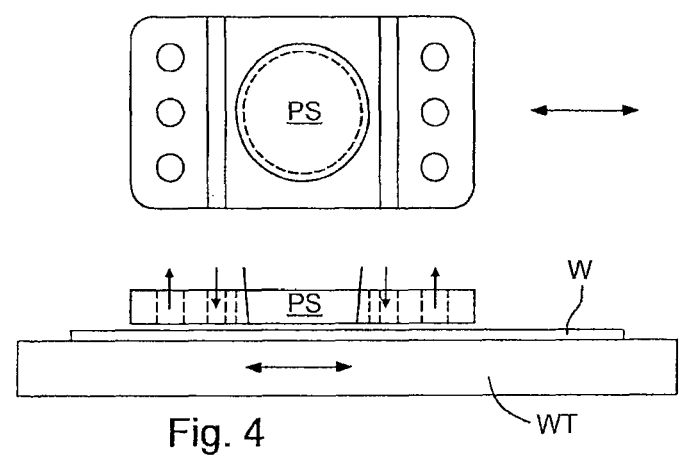
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate, substrate table or both. Such an arrangement is illustrated in FIG. 5.

FIG. 5 schematically depicts a localized liquid supply system or fluid handling structure 12. The fluid handing structure serves as a barrier, confining liquid to a localized surface of the underneath surface, such as of a substrate W, a substrate table WT or both. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W. The seal may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a lithe above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided underpressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

Another localized area arrangement is a fluid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The cornered shape has at least one low radius part (i.e. at a corner) which has a first radius of curvature which is low relative to a second radius of curvature at a high radius part (i.e. a part between corners and/or distant from corners). The low radius part has a first radius of curvature which is lower than a second radius of curvature present at the high radius part. The second radius of curvature may be infinity i.e. the high radius part may be straight. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

FIG. 6 illustrates schematically and in plan a meniscus pinning feature of a fluid handling system or of a fluid handling structure 12 having an extractor embodying the gas drag principle and to which an embodiment of the present invention may relate. The meniscus pinning feature is designed to resist, desirably prevent (as much as possible) the passage of fluid radially outwardly from the space 11. The features of a meniscus pinning device illustrated in FIG. 6 may, for example, replace the meniscus pinning arrangement 14, 15, 16 of FIG. 5. The meniscus pinning device of FIG. 6 is a form of extractor. The meniscus pinning device comprises a plurality of discrete openings 50. Each opening 50 is illustrated as being circular, though this is not necessarily the case. Indeed one or more of the openings 50 may be one or more selected from: circular, elliptical, rectilinear (e.g. square, or rectangular), triangular, etc. and one or more openings may be elongate. Each opening has, in plan, a length dimension (i.e. in the direction from one opening to the adjacent opening) of greater than or equal to 0.2 mm, greater than or equal to 0.5 mm, or greater than or equal to 1 mm. In an embodiment, the length dimension is selected from the range of 0.1 mm to 10 mm or selected from the range of 0.25 mm to 2 mm. In an embodiment, the width of each opening is selected from the range of 0.1 mm to 2 mm. In an embodiment the width of each opening is selected from the range of 0.2 mm to 1 mm. In an embodiment the length dimension is selected from the range of 0.2 mm to 0.5 mm or selected from the range of 0.2 mm to 0.3 mm. Inlet openings like those of FIG. 6 (labeled 180) may be provided radially inwardly of the openings 50.

Each of the openings 50 of the meniscus pinning device of FIG. 6 may be connected to a separate underpressure source. Alternatively or additionally, all or a plurality of the openings 50 may be connected to a common chamber or manifold (which may be annular) which is itself held at an underpressure. In this way a uniform underpressure at each or a plurality of the openings 50 may be achieved. The openings 50 can be connected to a vacuum source and/or the atmosphere surrounding the fluid handling system (or confinement structure) may be increased in pressure to generate the desired pressure difference.

In the embodiment of FIG. 6 the openings 50 are fluid extraction openings. Each opening is an inlet for the passage of gas, liquid or a two phase fluid of gas and liquid, into the fluid handling system. Each inlet may be considered to be an outlet from the space 11.

The openings 50 are formed in a surface of a fluid handling structure 12. The surface faces the substrate W and/or substrate table WT, in use. In an embodiment the openings 50 are in a substantially flat surface of the fluid handling structure 12. At least one of the openings may be in a ridge. The openings 50 may be defined by needles or tubes. The bodies of some of the needles, e.g., adjacent needles, may be joined together. The needles may be joined together to form a single body. The single body may form the cornered shape as described above.

The openings 50 are the end of a tube or elongate passageway, for example. Desirably the openings are positioned such that in use they are directed to, desirably facing, the facing surface, e.g. the substrate W. The rims (i.e. outlets out of a surface) of the openings 50 may be substantially parallel to a top surface of a part of the facing surface. An elongate axis of the passageway to which the opening 50 is connected may be substantially perpendicular (within +/−45°, desirably within 35°, 25° or even 15° from perpendicular) to the top of the facing surface, e.g., the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to hold, e.g. pin, the meniscus 320 between the openings 50 substantially in place as illustrated in FIG. 6. The gas flow helps maintain the liquid confined by momentum blocking, by a gas flow induced pressure gradient and/or by drag (shear) of the gas (e.g., air) flow on the liquid.

The openings 50 surround the space to which the fluid handling structure supplies liquid. The openings 50 may be distributed in an undersurface of the fluid handling structure. The openings 50 may be substantially continuously spaced around the space (although the spacing between adjacent openings 50 may vary). In an embodiment, liquid is extracted all the way around the cornered shape and is extracted substantially at the point at which it impinges on the cornered shape. This is achieved because the openings 50 are formed all the way around the space (in the cornered shape). In this way the liquid may be confined to the space 11. The meniscus may be pinned by the openings 50, during operation.

In an embodiment a gas knife 210 in the form of a slit opening may be provided around the meniscus pinning feature (e.g. the extractor 70 of the FIG. 11 embodiment described below or the openings 50 of the FIG. 6 embodiment). A gas knife in the form of a slit opening might typically have a width of 50 μm. The invention is not limited to a slit form of opening surrounding the meniscus pinning feature and, as described below, the slit opening may instead be a plurality of discrete apertures. Use of discrete gas supply openings compared to a slit may be advantageous as described in U.S. patent application No. 61/506,442, filed on 11 Jul. 2011, which is hereby incorporated by reference in its entirety.

Radially inwardly of the openings 50 which act as a meniscus pinning feature are a plurality of immersion fluid supply openings 180a-c. These provide immersion liquid between the fluid handling structure 12 and the substrate W to help ensure that the narrow gap between the undersurface of the fluid handling structure 12 and the substrate W is filled with liquid. The immersion fluid supply openings 180a-c can be useful in filling a gap between an edge of a substrate W and the substrate table WT with immersion liquid. This can eliminate or at least reduce the chance of a bubble of gas finding its way from the gap between the substrate W and substrate table WT into the immersion space 11.

Other geometries of the bottom of the fluid handling structure 12 are possible. For example, any of the structures disclosed in U.S. patent application publication no. US 2004-0207824 or U.S. patent application publication no. US 2010-0313974 could be used in an embodiment of the present invention.

In an embodiment the immersion fluid supply openings 180a-c may act as the at least one fluid opening of the substrate surface actuator 100. That is, the function of the plurality of immersion fluid supply openings 180a-c is dual. First, they function to provide immersion liquid between the fluid handling structure 12 and the substrate W. This is to help ensure that the narrow gap between the undersurface of the fluid handling structure 12 and the substrate W is filled with liquid. Second, the plurality of immersion fluid supply openings 180a-c function as the fluid opening of the substrate surface actuator 100. By varying the flow of fluid through the fluid openings 180a-c a force between the substrate surface actuator 100 and the substrate W can be varied.

The rate of flow of fluid through the at least one fluid opening 180a-c is controlled by the position controller 500. By varying the fluid flow through the fluid opening the position controller 500 can displace the substrate W relative to the projection system PS. In this way a force can be applied to the substrate relatively close to the target portion TP as illustrated in FIG. 6. Thus, the position of the target portion TP on a part of the substrate can be accurately controlled.

As can be seen, in the embodiment of FIG. 6 the fluid openings 180a-c of the substrate surface actuator 100 are close to the target portion TP, and certainly within fewer than 10 target portion widths (the width in the direction orthogonal to the scanning direction (direction X as illustrated in FIG. 6)). The closer the fluid openings 180a-c of the substrate surface actuator 100 are to the target portion TP the better for accuracy. In an embodiment the fluid openings are closer than five target portion widths to the optical axis O of the projection system PS. In one embodiment the fluid openings are within two target portion widths of the optical axis O of the projection system PS.

In the embodiment of FIG. 6 the fluid opening of the substrate surface actuator 100 is an opening in the fluid handling structure 12. The fluid opening is arranged to provide fluid therethrough onto the substrate W (as opposed to extraction of fluid from the substrate W). In an embodiment (such as that of FIG. 6) the fluid is liquid. This is desirable because it is easier to control the force applied by a flow of liquid than by a flow of gas. Additionally, the magnitude of the force can be much greater if the fluid is liquid because of the incompressible nature of liquid.

The arrangement in FIG. 6 is particularly convenient because the fluid supplied out of the fluid openings 180a-c is liquid which is desired to be present under the fluid openings 180a-c in any case. That is, because the fluid openings 180a-c are radially inwardly of the fluid extraction openings 50 in the undersurface of the fluid handling structure 12 (which are for the removal of liquid from between the fluid handling structure 12 and the substrate W) liquid is desired to be present under the fluid openings 180a-c in any case.

In an embodiment the fluid opening of the substrate surface actuator 100 is arranged to extract fluid (gas or liquid or both) from between the fluid handling structure and the substrate W. For example, the fluid opening of the substrate surface actuator 100 can be one or more of the extraction openings 50, with the force being varied by varying the underpressure applied to the opening 50 and thereby the flow rate through the opening 50. Alternatively or additionally, as illustrated and described below with reference to FIG. 11, the fluid opening of the substrate surface actuator 100 may be an opening of a single phase extractor (e.g. an extractor for the extraction of liquid in single phase). Such an extraction system comprises at least one opening which surrounds the space 11 between the final element of the projection system PS and the substrate W and resists passage of liquid radially outward relative to the space 11.

As illustrated in FIG. 6 the immersion fluid supply openings 180a-c forming the fluid opening of the substrate surface actuator 100 may be elongate, for example in the form of a slit. The slit may been divided into three discrete fluid openings 180a, 180b, 180c which together surround the space 11. There may or may not be gaps between adjacent slits. The gaps may or may not comprise an opening (e.g. an opening 180 not being a fluid opening of the substrate surface actuator 100). The rate of flow of fluid through each of the fluid openings 180a, 180b, 180c may be controlled individually by the position controller 500. In an embodiment, the flow through each of the openings 180a-c is controlled by a different controller.

An arrangement with at least three fluid openings surrounding the space 11 is advantageous in that the force applied to the substrate W by the substrate surface actuator 100 may be varied not only in the Z direction but also the Rx and Ry directions. The provision of three fluid openings 180a-c avoids over-actuation in that the generation of bending forces between the fluid openings can be avoided.

In an embodiment more than three fluid openings 180a-c are provided. For example, at least four fluid openings may be provided (as will be described below) and the position controller 500 may vary the fluid flow through the at least four openings to generate a bending force on the substrate W.

In the embodiment of FIG. 6 the three fluid openings are such that their centers, in plan, are positioned at substantially 120° intervals around the optical axis O of the projection system PS.

In an embodiment the fluid opening 180a-c substantially surrounds the optical axis O of the projection system PS. The fluid opening 180a-c forms a shape, in plan. In the example of FIG. 6 the shape is that of a circle. However, other shapes are possible, in particular cornered shapes as illustrated in FIGS. 10, 12-16 and 21-23, for example a rectilinear shape such as a square, a rhombus or a rectangle optionally with sides with a negative radius of curvature with respect to the center of the shape.

Various arrangements of fluid opening of a circular substrate surface actuator 100 are illustrated in FIGS. 17-20.

Instead, or in addition to openings 180a-c forming the fluid opening of the substrate surface actuator 100, the openings 50, or the gas knife 210, or both, may form the fluid opening of the substrate surface actuator 100. The openings 50 could be divided into more than one group as illustrated with the openings 180a-d in FIG. 10. The gas knife 210 could be segmented in a similar way to the immersion fluid supply openings 180a-c of FIG. 6. In an embodiment the gas knife 210 may be defined by a plurality of discrete openings instead of a slit. In an embodiment the openings 50 may be defined by one or more slits instead of discrete openings.

FIG. 7 illustrates, in cross-section, an embodiment of the fluid opening 180a of a substrate surface actuator 100. The embodiment of FIG. 7 illustrates one way in which the fluid flow through the fluid opening 180a may be varied with a suitable frequency. Liquid is provided along a conduit 300. A mass flow controller 310 controls the flow rate of liquid through a flow restriction 320 into a chamber 330. The chamber 330 is upstream of the fluid opening 180a. Because of the incompressible nature of liquid, normally the flow rate into the chamber 330 is equal to the flow rate of liquid out of the chamber through the fluid opening 180a. The liquid is directed by the opening 180a in a direction towards the substrate W. The force between the substrate surface actuator 100 and the substrate W can be varied by changing the flow rate.

One way in which the flow rate can be varied is to provide a plunger 340. The plunger 340 is moveable backwards and forwards (in the X direction as illustrated) into and out of chamber 330. As the plunger 340 moves into chamber 330 more liquid is forced out of the fluid opening 180a than is usually the case (because the flow restriction 320 resists liquid exiting the chamber 330 via the conduit 300). As the plunger 340 retracts out of chamber 330 the flow rate out of fluid opening 180a is reduced below the normal rate. The rate of extraction of the plunger 340 from the chamber 330 may need to be limited (compared to the rate of insertion) to avoid cavitation.

In an embodiment, the plunger 340 is driven as a voice coil. The voice coil is a Lorentz motor comprising coils 342 and permanent magnets in the plunger 340. A reaction force generated by movement of the plunger 340 may be transmitted in the X direction. A reaction force generated in the X direction can be dealt with out deleteriously affecting the dynamics of the apparatus.

Figure 8:
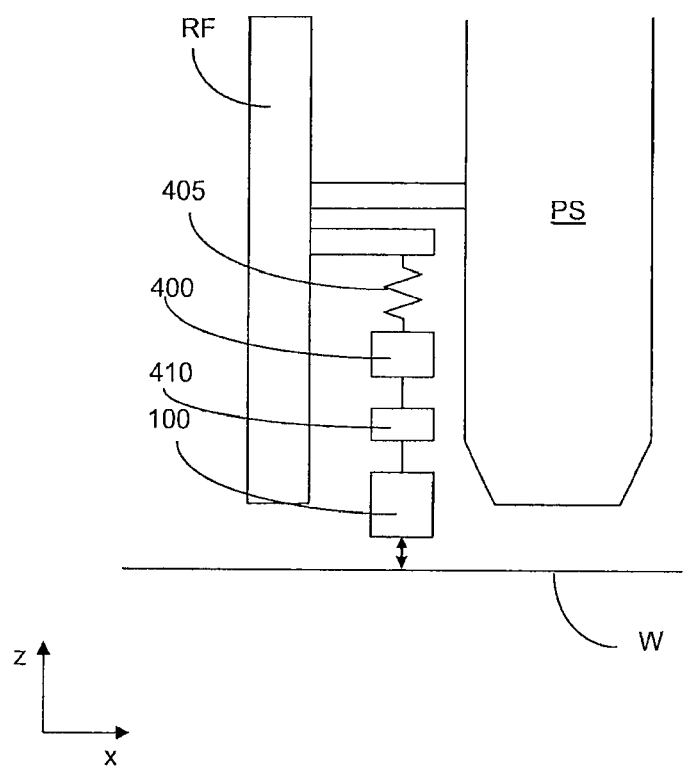
FIG. 8 illustrates, in cross-section, how a substrate surface actuator may be mounted.

FIG. 8 illustrates an embodiment of how the substrate surface actuator 100 is coupled to a reference frame RF of the apparatus. The projection system PS is also to some extent attached to the reference frame RF. Therefore, it is undesirable that forces are transmitted from the substrate surface actuator 100 to the reference frame RF where they would be transmitted onto the projection system PS.

For simplicity in FIG. 8 an embodiment is illustrated in which the substrate surface actuator 100 is not part of a fluid handling system to confine liquid to a space between a final element of the projection system PS and the substrate W. That is, the substrate surface actuator 100 of FIG. 8 is in a non immersion lithographic apparatus. However, the principles described with reference to FIG. 8 are equally applicable where the substrate surface actuator 100 is part of a fluid handling structure and in a case where a fluid handling structure is provided separately to the substrate surface actuator 100.

The forces applied to the substrate through the substrate surface actuator 100 are likely to have a frequency in the range of 0 to 500 Hz, perhaps between 0 and 300 Hz, between 1 Hz and 200 Hz, or between 2 Hz and 150 Hz. In order to isolate the reference frame RF from these vibrations in an embodiment a reaction mass 400 is provided between the substrate surface actuator 100 and the reference frame RF. The reaction mass 400 has a relatively high mass (e.g. about 0.5 kg to 5 kg, compared to a mass of the liquid handling structure 12 or actuator 100 of 2 to 3 kg). An actuator 410 is positioned between the reaction mass 400 and the substrate surface actuator 100. The actuator 410 is controlled by a controller (for example the positioning controller 500) in order to position the substrate surface actuator 100. Thus, the actuator 450 positions the substrate surface actuator 100 relative to the reference frame RF. When a variation in fluid flow through the fluid opening occurs the substrate surface actuator 100 remains a substantially constant height above the substrate W.

In order to isolate the reaction force from the reference frame RF, an elastic coupling 405 is used to couple the reaction mass 400 to the reference frame RF. The coupling 405 and reaction mass 400 have an eigen-frequency substantially lower than the expected frequency of forces applied to the substrate W by the substrate surface actuator 100. For example, the suspension eigen-frequency is between 2 and 20 Hz, desirably 5 and 15 Hz. A permitted frequency of force variation of the substrate surface actuator 100 is 1 kHz or above. Desirably the frequency is less than 5 kHz. Desirably the permitted frequency of force variation of the substrate surface actuator 100 is between 1 and 5 kHz, desirably towards 5 kHz.

In an embodiment the fluid opening may be a fluid opening not used for the confinement of liquid in the space 11 (and/or provision of liquid to the immersion space). Examples are illustrated in FIGS. 10, 15, 16, 19 and 20 in connection with discrete force applicators 450 described below. The openings may be radially inward or radially outward with respect to the space 11 of any openings (e.g. 50, 70) in the undersurface of the fluid handling structure 12 used for maintenance of liquid in the space 11 between the projection system PS and the substrate W. The fluid opening of the substrate surface actuator 100 may be part of a discrete force applicator.

Figure 9:
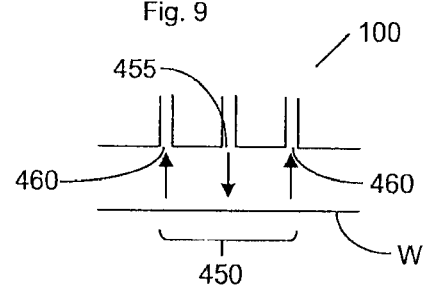
FIG. 9 illustrates, in cross-section, a discrete fluid opening.

FIG. 9 illustrates in cross-section a discrete force applicator 450 comprising a fluid opening 455 of a substrate surface actuator 100 of an embodiment. In the case of FIG. 9 the fluid opening 455 may be an opening of a substrate surface actuator 100 which is not in a fluid handling structure (such as the embodiment of FIG. 8). Alternatively or additionally, the fluid opening 455 may be radially outward with respect to a space 11 of any openings in an undersurface of a fluid handling structure used for provision and/or maintenance of liquid in a space 11 between the projection system and the substrate. Such discrete force applicators 450a, 450b are illustrated in FIGS. 15, 16, 19 and 20, described below. In this case it is desirable still to have liquid as the fluid. Therefore, the liquid exiting the fluid opening needs to be collected. For this purpose at least one fluid extraction opening 460 is provided surrounding the fluid opening 455. The fluid extraction opening(s) 460 is/are connected to an underpressure source to remove liquid on the surface of the substrate W from the fluid opening 455. In an embodiment, at least three or four of the discrete force applicators 450 are used.

FIG. 9 is just an exemplary embodiment and other measures may be taken in order to recover the liquid. Alternatively the fluid exiting the fluid opening 455 may be gas in which case the provision of a fluid extraction opening 460 may not be necessary. The fluid extraction opening 460 surrounds the fluid opening 455. The fluid extraction opening 460 may be in the form of a plurality of openings such as the openings 50 described above with reference to FIG. 6. In an embodiment, the fluid opening 455 is connected to an underpressure source to apply an attractive force to the substrate W.

Other types of discrete force applicator may be possible.

FIG. 10 illustrates an embodiment which is the same as the embodiment of FIG. 6 except as described below.

In the FIG. 10 embodiment the openings 50 are positioned so as to form, in plan, a cornered shape (i.e. a shape with corners 52). In the case of FIG. 10 this is in the shape of a rhombus, desirably a square, with curved edges or sides 54. The edges 54, if curved, have a negative radius. The edges 54 may be straight. The edges 54 may curve towards the center of the cornered shape in areas away from the corners 52. An embodiment of the invention may be applied to any shape, in plan, including but not limited to the shape illustrated, for example, a rectilinear shape, e.g. a rhombus, a square or rectangle, or a circular shape, a triangular shape, a star shape, an elliptical shape, etc.

The cornered shape has principal axes 110, 120 aligned with the major directions of travel of the substrate W under the projection system PS. This helps ensure that, below a critical scan speed, the maximum scan speed is faster than if the openings 50 were arranged in a circular shape. This is because the force on the meniscus between two openings 50 is reduced with a factor cos θ. Here θ is the angle of the line connecting the two openings 50 relative to the direction in which the substrate W is moving.

The use of a square cornered shape allows movement in the step and scanning directions to be at an equal maximum speed. This may be achieved by having each of the corners 52 of the shape aligned with the scanning and stepping directions 110, 120. If movement in one of the directions, for example the scan direction is preferred to be faster than movement in the step direction then a rhombus shape could be used. In such an arrangement the primary axis (e.g. the longest axis) of the rhombus may be aligned with the scan direction. For a rhombic shape, although each of the corners may be acute, the angle between two adjacent sides of the rhombus, for example in the stepping direction, may be obtuse. The obtuse angle may be more than 90° (for example selected from the range of about 90° to 120°, in an embodiment selected from the range of about 90° to 105°). In an embodiment selected from the range of about 85° to 105°).

Throughput can be optimized by making the primary axis of the shape of the openings 50 aligned with the major direction of travel of the substrate (usually the scan direction). A second axis may be aligned with the other major direction of travel of the substrate (usually the step direction). It will be appreciated that any arrangement in which θ is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If less than 90° were desired it would be necessary to select one direction to have corners with less than 90° with the result that the other corner would have an angle of greater than 90°.

There may be no meniscus pinning feature radially inwardly of the openings 50. The meniscus is pinned between the openings 50 with drag forces induced by gas flow into the openings 50. A gas drag velocity of greater than or equal to about 15 m/s, desirably about 20 m/s should be sufficient. The amount of evaporation of liquid from the substrate may be reduced thereby reducing both splashing of liquid in the form of one or more droplets as well as thermal expansion/contraction effects.

The gas knife 210 is illustrated as being provided by a series of discrete openings 210. However, in an embodiment the gas knife is provided as a slit, as in the embodiment of FIG. 6.

In the embodiment of FIG. 10 the fluid openings 180 may be the fluid openings of the substrate surface actuator 100. As is illustrated, the fluid openings 180 are provided as discrete openings. The discrete openings may be divided into groups arranged in a line. The fluid flow through the openings of a single group may be controlled together by the controller 500. As illustrated the fluid openings 180 are divided into four groups 180a-d thereby providing the substrate surface actuator 100 with four sets of fluid openings. The fluid flow through each set can be varied to displace and/or orientate and/or bend the substrate W relative to the projection system under the control of the position controller 500. Alternatively or additionally the openings 50 may be the fluid openings of the substrate surface actuator 100.

Alternatively or additionally discrete force applicators 450a may be provided radially inwardly of the openings 50. Alternatively or additionally discrete force applicators 450b may be provided radially outwardly of the gas knife openings 210.

The discrete force applicators 450a, 450b may be for the provision of liquid, for example immersion liquid, into the space between the undersurface of the fluid handling structure 12 and the substrate W.

In an embodiment the discrete force applicators 450b which are provided radially outward of the openings 50 provide gas or liquid onto the top surface of the substrate W to generate the force. In the case of the openings 450b providing liquid, the openings may be as described and illustrated in FIG. 9. Various arrangements of fluid openings of the substrate surface actuator 100 are illustrated for a square fluid handling structure in FIGS. 12-16.

FIG. 11 illustrates a fluid handling structure 12 which is part of a liquid supply system. The fluid handling structure 12 extends around the periphery (e.g. circumference) of the final element of the projection system PS.

A plurality of openings 20 in the surface which in part defines the space 11 provides the liquid to the space 11. The liquid passes through openings 29, 20 in side walls 28, 22 respectively through respective chambers 24, 26 prior to entering the space 11.

A seal is provided between the bottom of the fluid handling structure 12 and a facing surface, e.g. the substrate W, or a substrate table WT, or both. In FIG. 11 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow of liquid therethrough; the opening 55 may be beneficial if the control plate 51 is displaced in the Z direction (e.g., parallel to the optical axis of the projection system PS). Radially outwardly of the flow control plate 51 on the bottom surface of the fluid handling structure 12 facing (e.g., opposite) the facing surface, e.g., the substrate W, may be an immersion fluid supply opening 180. The immersion fluid supply opening 180 can provide immersion fluid (e.g. liquid, for example an aqueous solution or water) in a direction towards the facing surface. During imaging this may be useful in preventing bubble formation in the immersion liquid by filling a gap between the substrate W and substrate table WT with liquid.

Radially outwardly of the immersion fluid supply opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature.

Radially outwardly of the extractor assembly may be a gas knife 210. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet which is covered in a porous material 111 which is used to separate liquid from gas to enable single-liquid phase liquid extraction. An underpressure in chamber 121 is chosen is such that the meniscuses formed in the holes of the porous material 111 substantially prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 150 micrometer, desirably in the range of 5 to 100 micrometers and more desirably in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than or equal to 90°, desirably less than or equal to 85° or desirably less than or equal to 80°, to the immersion liquid, e.g. water.

In an embodiment, the liquid supply system has an arrangement to deal with variations in the level of the liquid. This is so that liquid which builds up between the projection system PS and the liquid confinement structure 12 (forming, e.g., a meniscus 25) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. An additional or alternative way of dealing with this liquid is to provide an outlet 201 to remove liquid reaching a certain point (e.g., height) relative to the liquid confinement structure 12 and/or projection system PS.

In the fluid handling structure 12 of FIG. 11 the fluid opening of the incorporated substrate surface actuator 100 is illustrated as being the openings of the extractor 70. That is, by varying the pressure in the chamber 121 using a plunger 340 the force applied by the extractor 70 to the substrate W may be varied. Alternatively or additionally the liquid supply opening 180 may be the fluid opening of the substrate surface actuator, as described in detail with respect to FIG. 6 or FIG. 10.

In the embodiment of FIG. 11 a gas knife 210 is provided radially outwardly of the extractor 70. In an embodiment the gas knife 210 may be a fluid opening of the substrate surface actuator 100, as with the embodiments of FIGS. 6 and 10. By varying the gas flow out of the gas knife 210 the force applied to the substrate W can be varied.

In an embodiment a fluid opening of the substrate surface actuator 100 which is connected to an underpressure source may be provided radially outwardly of the meniscus pinning feature of a fluid handling device (for example the openings 50 of FIGS. 6 and 10 or the extractor 70 of FIG. 11) and/or radially outwardly of the gas knife 210. Such a fluid opening attached to an underpressure source can be used to apply an attractive force between the substrate surface actuator 100 and the substrate W.

The immersion liquid supply opening 180 is particularly suited for use as a substrate surface actuator 100 because during normal use a flow of liquid onto the substrate W out of the liquid supply opening 180 is present. Therefore, an increase or reduction in force between the fluid handling structure 12/substrate surface actuator 100 and the substrate W can be varied in both directions (e.g. increased or decreased).

The control of the substrate surface actuator 100 by the position controller 500 may be feedforward or feedback.

In an embodiment, the position controller 500 adjusts the flow rate through the fluid opening of the substrate surface actuator 100 to maintain a constant total force to the substrate W. This simplifies the control as the second positioner PW need not then be adjusted to compensate for the total change in force.

One or more sensors may be provided in the substrate surface actuator 100. The sensor may be used to measure the position of the substrate and/or a distance between the substrate surface actuator 100 and the substrate. The sensor may be of any type including, but not limited to the group consisting of: a gas (e.g., air) gauge sensor, a capacitor sensor and/or an optical sensor. The sensor may be mounted in/on the undersurface of the body of the actuator 100. A gas knife 210 may operate simultaneously as a gas gauge sensor.

The output of the sensor may be provided to the position controller 500. The output may be used to determine a control signal to control the flow rate through the fluid opening of the substrate surface actuator 100 and/or to control the actuator 410.

In an embodiment the actuator 410 is not energized when the position controller 500 varies the flow rate of fluid through the fluid opening of the substrate surface actuator 100.

In an embodiment the actuator 410 is driven as a damper by the position controller 500 during variation of fluid flow rate through the fluid opening of the substrate surface actuator 100. When the actuator 410 is driven as a damper, it is used to help prevent vibrations from reaching the projection system PS. In an embodiment the actuator 410 is configured to lift and lower the substrate surface actuator 100 and connect it to the reference frame RF.

In order to prevent or reduce cross-talk, a control frequency of the system to vary the flow rate (e.g. the voice coil 342) is different from that of other components. The restriction 320 between the chamber 330 and mass flow controller 310 also helps in this regard. The mass flow controller 310 is controlled at low-bandwidth frequencies.

The size of a fluid handling structure 12 determines the size of the substrate table WT. This is because the fluid handling structure 12 should be supported by the substrate table WT at all positions, for example while the substrate is scanned. Therefore, by increasing the footprint of the fluid handling structure 12 the footprint of the substrate table WT should be increased. This is undesirable as increasing the size of the substrate table WT involves larger actuators to move the greater mass and a larger footprint of the whole apparatus. Therefore, it is desirable that the fluid opening of the substrate surface actuator 100 does not increase or at least not excessively increase the footprint of the fluid handling structure 12. The use of discrete force applicators 450 within the existing footprint of the fluid handling structure 12 are desirable. If the discrete force applicators 450 are outside of the footprint of the existing fluid handling structure 12 (for example outside of the gas knife 210), locations along the sides in the case of a rectilinear shaped fluid handling structure (as in FIG. 15) are desired over positioning the discrete force applicators 450b at the corners (as in FIG. 16). This helps to ensure an outer periphery of the footprint of the discrete force applicators and the fluid handling structure does not involve a larger, or even excessive, table surface area to support the outer periphery of the footprint.

FIGS. 12-22 illustrate various arrangements of substrate surface actuator. The figures are schematic representations of a selection of different embodiments of actuator. In the case of the embodiments of FIGS. 12-14, 17, 18 and 21 to 23 the substrate surface actuator 100 may or may not be incorporated in a fluid handling structure 12 even though they are labeled as being immersion fluid supply openings 180. In the embodiments of FIGS. 15, 16, 19 and 20 the substrate surface actuator 100 is incorporated into a fluid handling structure 12. In these figures, the squares or circles represent the shape made, in plan, by features in the undersurface of the fluid handling structure 12/substrate surface actuator 100. The lines represent slits (e.g. an elongate opening) or a grouping of a plurality of discrete fluid openings of the substrate surface actuator 100. In all embodiments the elongate fluid opening or grouping of a plurality of discrete openings extends around a portion of the shape made in plan.

For the examples of FIGS. 12-14, 17, 18 and 21 to 23 the lines may represent shapes made by a plurality of fluid openings, in plan. The fluid openings may be fluid openings of a substrate surface actuator 100 and/or may be the shape made in plan by openings in the undersurface of a fluid handling structure 12 (such as openings 50, liquid supply openings 180, gas knife 210 etc.).

In the embodiments of FIGS. 12-16 the openings are arranged, in plan, in a cornered shape. In the embodiment of FIGS. 12-16 the shape has four corners. The corners 52 are aligned with the scan and step directions of the substrate W.

In FIG. 12, the fluid openings are split into three with a leading fluid supply opening 180a which incorporates a leading corner 52a of the shape, in plan. The leading fluid supply opening 180a extends equidistantly from the leading corner 52a. Two other fluid openings 180b, are each provided so as to include a corner which is aligned with the step direction of the substrate W. The opening 180b includes substantially all of one side of the shape, in plan. In an embodiment, the length of the two sorts of opening 180a, b are the same. In an embodiment, the force applied by the two sorts of opening can be in the same range.

In the embodiment of FIG. 13 there are four openings 180a. Each opening 180a extends around a corner of the shape and a portion of the sides of the shape. Each opening 180a may be of the same length. The range of force applied through each opening may be the same. Each opening 180a may extend equidistantly from its respective corner.

In the embodiment of FIG. 14 each opening 180a extends along the length of a side and does not incorporate a corner. The length of each opening 180a may be the same. The openings 180a are positioned substantially equidistant from adjacent corners 52.

In the embodiments of FIGS. 15 and 16 discrete force applicators 450 such as illustrated in FIG. 9 are provided. Both the embodiments FIGS. 15 and 16 illustrate discrete force applicators 450b outside of features used to confine immersion liquid to the space 11 (shown in solid lines). Also shown in dashed lines are discrete force applicators 450a inside features used to maintain liquid in the space 11. The openings 450a, 450b are the same as those shown in FIG. 10. In the embodiment of FIG. 15 the discrete force applicators 450a, 450b are adjacent sides 54 of the shape in plan. The discrete force applicators 450a, 450b are positioned substantially equidistant from adjacent corners 52 of the cornered shape.

In the embodiment of FIG. 16 the discrete force applicators 450a, 450b are positioned at corners 52 of the shape, in plan. They are positioned adjacent corners 52 of the cornered shape.

In arrangements of the embodiments shown in FIGS. 15 and 16, one or both of inner and outer discrete force applicators 450a, 450b may be present.

Figure 17:
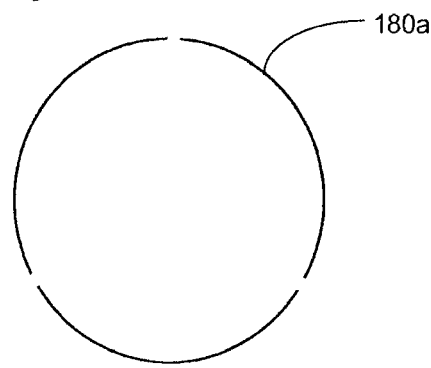
FIG. 17 illustrates, schematically and in plan, a substrate surface actuator of an embodiment.
Figure 18:
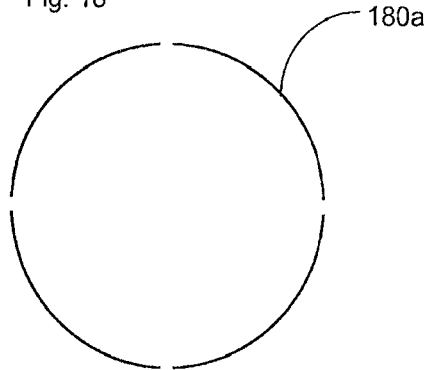
FIG. 18 illustrates, schematically and in plan, a substrate surface actuator of an embodiment.

FIGS. 17 and 18 illustrate a circular arrangement, for example as illustrated in FIG. 6. FIG. 17 illustrates an embodiment where there are three fluid openings of the substrate surface actuator 100 or three discrete sets of grouped openings. In an embodiment each of the three openings has the same length. In the embodiment of FIG. 17 the center of each fluid opening or group is positioned substantially at 120° intervals around an optical axis O of the projection system. FIG. 18 illustrates an embodiment in which there are four fluid openings or discrete openings grouped into four sets. In the embodiment of FIG. 18 the centers, in plan, of the four fluid openings or groups are positioned at substantially 90° intervals around the optical axis O of the projection system.

Figure 19:
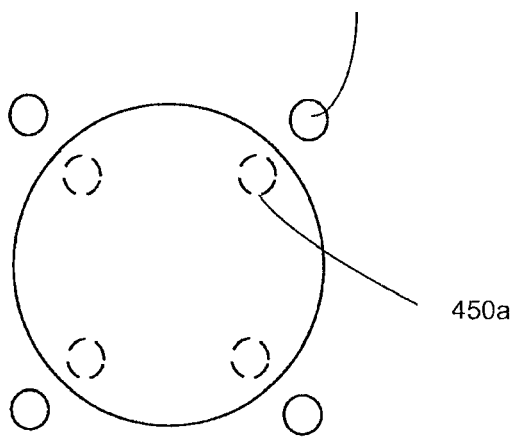
FIG. 19 illustrates, schematically and in plan, a substrate surface actuator of an embodiment.
Figure 20:
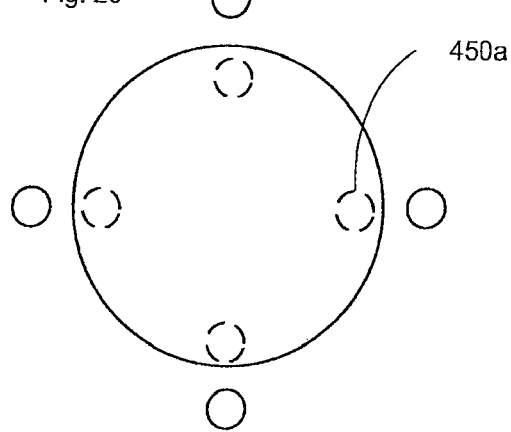
FIG. 20 illustrates, schematically and in plan, a substrate surface actuator of an embodiment.

The embodiments of FIGS. 19 and 20 are the same as the embodiments of FIGS. 15 and 16 except that the shape made, in plan, is circular rather than square. The discrete force applicators 450a, 450b may be aligned with the scanning and stepping directions and the center of the shape, in plan, as shown in FIG. 20. In an embodiment, the discrete force applicators 450a, 450b are not aligned with the scanning and stepping direction and the center of the shape in plan, as shown in FIG. 19.

The embodiments of FIGS. 21, 22 and 23 are in the case where the shape made, in plan, is rectilinear (e.g. rectangular) with the sides aligned with the scanning and step directions, rather than the corners. The fluid openings 180a may be arranged to extend along sides (the embodiment of FIG. 21). The openings 180a are positioned substantially equidistant from adjacent corners 52. The fluid openings 180b may be arranged to incorporate corners (the embodiment of FIG. 22). Each opening 180b may extend equidistantly from its respective corner. The one or more fluid openings 180b may incorporate corners and one or more fluid openings 180a may extend along a side (the embodiment of FIG. 23). The embodiments of FIGS. 21-23 may be particularly suited for a system in which a single phase extractor 70 such as that illustrated in FIG. 11 is used.

In an embodiment, there is provided a lithographic apparatus comprising: a substrate table constructed to hold a substrate; a projection system configured to project a patterned radiation beam onto a target portion of the substrate; a substrate surface actuator comprising a fluid opening for fluid flow therethrough from/onto a facing surface facing the substrate surface actuator to generate a force between the substrate surface actuator and the facing surface, the facing surface being a top surface of the substrate or a surface substantially co-planar with the substrate; and a position controller to control the position and/or orientation of a part of the facing surface by varying fluid flow through the fluid opening to displace the part of the facing surface relative to the projection system.

In an embodiment, the position controller is configured to control the position and/or orientation of a portion of the target portion of the substrate. In an embodiment, the substrate surface actuator comprises at least three fluid openings for fluid flow therethrough to generate a force between the substrate surface actuator and the facing surface. In an embodiment, the fluid openings are such that their centers, in plan, are positioned at substantially 120° intervals or lower around an optical axis of the projection system. In an embodiment, the substrate surface actuator comprises at least four fluid openings for fluid flow therethrough to generate a force between the substrate surface actuator and the facing surface. In an embodiment, the position controller is configured to control bending of the facing surface by varying fluid flow through the fluid opening(s). In an embodiment, each fluid opening is a group of discrete openings arranged in a line. In an embodiment, the lithographic apparatus further comprises a fluid handling structure configured to confine liquid to a space between a final element of the projection system and the facing surface. In an embodiment, the fluid opening is an opening in the fluid handling structure. In an embodiment, the fluid opening is radially inward with respect to the space of a fluid extraction opening formed in an undersurface of the fluid handling structure for removal of liquid from between the fluid handling structure and the facing surface. In an embodiment, the fluid opening is an opening of an extractor, which surrounds the space between the final element of the projection system and the substrate, to resist passage of liquid radially outward relative to the space. In an embodiment, the extractor is a single phase extractor to extract liquid. In an embodiment, the fluid opening is radially outward with respect to the space of any openings in an undersurface of the fluid handling structure used for maintenance of liquid in the space between the projection system and the facing surface. In an embodiment, the fluid opening is for the provision of fluid therethrough onto the facing surface. In an embodiment, the fluid opening is for the provision of liquid therethrough onto the facing surface. In an embodiment, the fluid opening is for extraction of fluid from the facing surface. In an embodiment, the fluid opening is elongate. In an embodiment, the fluid opening substantially surrounds an optical axis of the projection system. In an embodiment, the fluid opening forms a shape, in plan. In an embodiment, the lithographic apparatus comprises a plurality of the fluid openings, each fluid opening extending around a portion of the shape. In an embodiment, the shape is a cornered shape. In an embodiment, the shape has at least four corners. In an embodiment, the or at least one fluid opening extends around at least one corner. In an embodiment, the or at least one fluid opening extends between corners. In an embodiment, the or at least one fluid opening is discrete, in plan. In an embodiment, the lithographic apparatus further comprises one or more other openings to handle fluid on the facing surface, the one or more other openings arranged in a cornered shape, in plan. In an embodiment, the or each fluid opening is adjacent a corner of the cornered shape. In an embodiment, the or each fluid opening is positioned substantially equidistant from adjacent corners of the cornered shape. In an embodiment, the lithographic apparatus further comprises a chamber upstream of each fluid opening. In an embodiment, the lithographic apparatus further comprises a plunging member configured to insert in and/or extract out of the chamber to vary a force applied by the substrate surface actuator. In an embodiment, the lithographic apparatus further comprises a mass flow controller configured to provide fluid to the chamber at a certain mass flow rate. In an embodiment, the lithographic apparatus further comprises a reference frame to which the projection system and substrate surface actuator are coupled. In an embodiment, the lithographic apparatus further comprises a reaction mass between the substrate surface actuator and the reference frame. In an embodiment, the lithographic apparatus further comprises an actuator, between the substrate surface actuator and the reaction mass, to position the substrate surface actuator relative to the reference frame. In an embodiment, the reaction mass is coupled to the reference frame with an eigen frequency of between 1 and 50 Hz, between 2 and 20 Hz or between 5 and 15 Hz. In an embodiment, the target portion has the target portion width and the fluid openings are, in plan, positioned within a distance of less than 10 target portion widths of the optical axis of the projection system.

In an embodiment, there is provided a device manufacturing method comprising: using a projection system to project a patterned radiation beam onto a target portion of a substrate; and using a substrate surface actuator to control a position and/or orientation of a facing surface facing the substrate surface actuator relative to the projection system by varying fluid flow from/onto the facing surface through a fluid opening of a substrate surface actuator, the facing surface being a top surface of the substrate or a surface substantially co-planar with the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention, at least in the form a method as herein described, may be practiced otherwise than as described. For example, the embodiments of the invention, at least in the form of a method, may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or multiple processors are configured to communicate with at least one of the controllers. For example, each controller may include one or more processors for executing the computer programs that include machinereadable instructions for the methods described above. The controllers may include data storage media for storing such computer programs, and/or hardware to receive such media. So the controller(s) may operate according the machine readable instructions of one or more computer programs.

The invention may be applied to substrates with a diameter of 300 mm or 450 mm or any other size.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In an embodiment, the lithographic apparatus may comprise an encoder system to measure the position, velocity, etc. of a component of the apparatus. In an embodiment, the component comprises a substrate table. In an embodiment, the component comprises a measurement and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or cleaning table) has one or more of sensors, transducers or readheads that cooperate with the scale(s) or grid(s) to determine the position, velocity, etc. of the component.

In an embodiment, the lithographic apparatus comprises a liquid confinement structure that has a liquid removal device (or meniscus pinning feature) having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a substrate table constructed to hold a substrate;
a projection system configured to project a patterned radiation beam onto a target portion of the substrate;
a fluid handling structure configured to confine liquid to a space between a final element of the projection system and a facing surface, the facing surface being a top surface of the substrate or a surface substantially co-planar with the substrate;
a substrate surface actuator comprising a fluid opening for fluid flow therethrough from/onto the facing surface to generate a force between the substrate surface actuator and the facing surface, wherein the fluid opening extends around a corner; and
a position controller to control the position and/or orientation of a part of the facing surface toward a desired position and/or orientation of the part, by varying fluid flow through the fluid opening to displace the part of the facing surface relative to the projection system.

2. The lithographic apparatus of claim 1, wherein the substrate surface actuator comprises at least three fluid openings for fluid flow therethrough to generate a force between the substrate surface actuator and the facing surface.

3. The lithographic apparatus of claim 2, wherein the fluid openings are such that their centers, in plan, are positioned at substantially 120° intervals or lower around an optical axis of the projection system.

4. The lithographic apparatus of claim 1, wherein the position controller is configured to control bending of the facing surface by varying fluid flow through the fluid opening.

5. The lithographic apparatus of claim 1, wherein the fluid opening is a group of discrete openings arranged in a line.

6. The lithographic apparatus of claim 1, wherein the fluid opening is an opening in the fluid handling structure.

7. The lithographic apparatus of claim 1, wherein the fluid opening comprises an opening radially inward with respect to the space of a fluid extraction opening formed in an undersurface of the fluid handling structure for removal of liquid from between the fluid handling structure and the facing surface.

8. The lithographic apparatus of claim 1, wherein the fluid opening comprises an opening of an extractor, which surrounds the space between the final element of the projection system and the substrate, to resist passage of liquid radially outward relative to the space.

9. The lithographic apparatus of claim 1, wherein the fluid opening is radially outward with respect to the space of any openings in an undersurface of the fluid handling structure used for maintenance of liquid in the space between the projection system and the facing surface.

10. The lithographic apparatus of claim 1, wherein the fluid opening is configured to provide liquid therethrough onto the facing surface.

11. The lithographic apparatus of claim 1, wherein the fluid opening is configured to extract fluid from the facing surface.

12. The lithographic apparatus of claim 1, wherein the fluid opening is elongate.

13. The lithographic apparatus of claim 1, wherein the fluid opening extends between corners.

14. The lithographic apparatus of claim 1, further comprising one or more other openings to handle fluid on the facing surface, the one or more other openings arranged in a cornered shape, in plan.

15. The lithographic apparatus of claim 1, further comprising a chamber upstream of the fluid opening and a mass flow controller configured to provide fluid to the chamber at a certain mass flow rate.

16. The lithographic apparatus of claim 1, further comprising a reference frame to which the projection system and substrate surface actuator are coupled.

17. The lithographic apparatus of claim 16, further comprising a reaction mass between the substrate surface actuator and the reference frame.

18. The lithographic apparatus of claim 17, wherein the reaction mass is coupled to the reference frame with an eigen frequency of between 1 and 50 Hz.

19. The lithographic apparatus of claim 1, wherein the target portion has a target portion width and the fluid opening is, in plan, positioned within a distance of less than 10 target portion widths of the optical axis of the projection system.

20. A device manufacturing method comprising:
using a projection system to project a patterned radiation beam onto a target portion of a substrate;
confining liquid to a space between a final element of the projection system and a facing surface using a fluid handling structure, the facing surface being a top surface of the substrate or a surface substantially co-planar with the substrate; and
using a substrate surface actuator to control a position and/or orientation of the facing surface relative to the projection system toward a desired position and/or orientation of the part, by varying fluid flow from/onto the facing surface through a fluid opening of a substrate surface actuator, the fluid opening extending around a corner.

21. A lithographic apparatus comprising:
a substrate table constructed to hold a substrate;
a projection system configured to project a patterned radiation beam onto a target portion of the substrate;
a fluid handling structure configured to confine liquid to a space between a final element of the projection system and a facing surface, the facing surface being a top surface of the substrate or a surface substantially co-planar with the substrate;
a substrate surface actuator comprising a fluid opening for fluid flow therethrough from/onto the facing surface to generate a force between the substrate surface actuator and the facing surface; and
a position controller to control the position and/or orientation of a part of the facing surface based on a measured position, orientation and/or distance, by varying fluid flow through the fluid opening to displace the part of the facing surface relative to the projection system.

* * * * *